US006720809B2

(12) United States Patent
Canard et al.

(10) Patent No.: US 6,720,809 B2
(45) Date of Patent: Apr. 13, 2004

(54) FREQUENCY CONVERTER ENABLING A NON-INTEGER DIVISION RATIO TO BE PROGRAMMED BY MEANS OF A UNIQUE CONTROL WORD

(75) Inventors: David Canard, Caen (FR); Vincent Fillatre, Thaon (FR)

(73) Assignee: Koninklijke Philips Electronics N.V., Eindhoven (NL)

( * ) Notice: Subject to any disclaimer, the term of this patent is extended or adjusted under 35 U.S.C. 154(b) by 19 days.

(21) Appl. No.: 10/201,668

(22) Filed: Jul. 23, 2002

(65) Prior Publication Data

US 2002/0175774 A1 Nov. 28, 2002

Related U.S. Application Data

(63) Continuation of application No. 09/798,544, filed on Mar. 2, 2001, now Pat. No. 6,459,303.

(30) Foreign Application Priority Data

Mar. 10, 2000 (FR) .............................................. 00 03135

(51) Int. Cl.$^7$ ................................................ H03K 21/00
(52) U.S. Cl. ...................................... 327/156; 327/115
(58) Field of Search .......................... 327/156, 47, 117, 327/115, 48

(56) References Cited

U.S. PATENT DOCUMENTS 5,337,024 A * 8/1994 Collins ........................ 332/127
5,610,559 A * 3/1997 Dent ............................. 331/2

* cited by examiner

*Primary Examiner*—Dinh T. Le
(74) *Attorney, Agent, or Firm*—Michael J. Ure

(57) ABSTRACT

The invention relates to a frequency converter FCV comprising a frequency divider FRACN, and an input port REG intended to receive a control word N(1:L) which determines a division ratio between the input FLO and output FDIV frequencies of the frequency divider FRACN. The frequency converter in accordance with the invention FCV additionally comprises interface means INT, arranged between the input port REG and the frequency divider FRACN, and intended to carry out a conversion of a control word value N(1:L) to a first and a second parameter M(1:L-P) and k(1:P) which jointly define a non-integer value of the division ratio of the frequency divider FRACN. The invention enables the user to program the frequency divider FRACN by means of a unique control word N(1:L), while customarily two control words are necessary to program non-integer division ratios.

2 Claims, 2 Drawing Sheets

Figure 1:
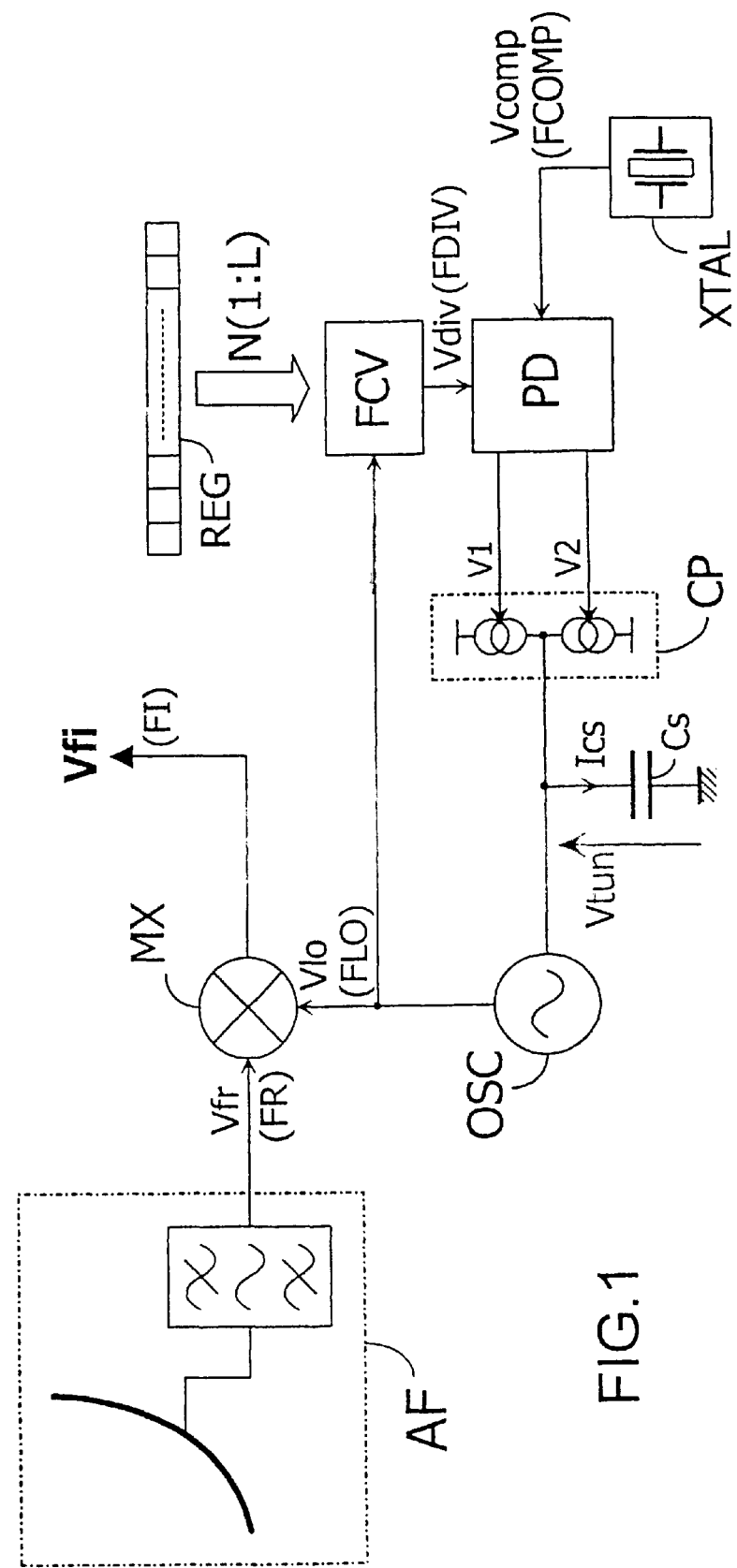

FREQUENCY CONVERTER ENABLING A NON-INTEGER DIVISION RATIO TO BE PROGRAMMED BY MEANS OF A UNIQUE CONTROL WORD

CROSS REFERENCE TO RELATED APPLICATIONS

This is a continuation of application Ser. No. 09/798,544, filed Mar. 2, 2001, U.S. Pat. No. 6,459,303.

The invention relates to a frequency converter comprising:

a frequency divider intended to receive an input signal having a so-called input frequency, and to supply an output signal having a so-called output frequency, and an input port intended to receive a control word determining a division ratio between the input and output frequencies of the frequency divider.

Such frequency converters are commonly employed in phase-locked loops intended to adjust and regulate a so-called oscillation frequency of an output signal of an oscillator. Such a phase-locked loop is described in European patent application EP 0 821 488 A1. In most of the known phase-locked loops, the frequency divider receives the output signal from the oscillator and supplies, to a phase/frequency comparator, an output signal having a frequency that is N times lower than the oscillation frequency, N being an integer equal to that of the control word. The phase/frequency comparator compares this frequency with a so-called comparison frequency of a reference signal originating, for example, from a quartz oscillator. If the output frequency of the frequency divider is below the comparison frequency, the phase/frequency comparator commands an increase of the oscillation frequency until the oscillation frequency is equal to N times the comparison frequency. Since the comparison frequency is fixed, the choice of the value of N of the control word determines the value of the oscillation frequency. Consequently, the minimum interval between two oscillation frequency values is equal to the value of the comparison frequency. It has been found that the performance in terms of noise of a phase-locked loop is better as the comparison frequency is higher. However, choosing a high comparison frequency means an increase of the minimum interval between two values of the oscillation frequency, which interval is determined by the conditions wherein the phase-locked loop is employed. Thus, in applications where the output signal of the oscillator is used to receive hertzian digital television signals, this minimum interval is predetermined and set at 166.67 kHz.

To maintain a constant minimum interval while increasing the value of the comparison frequency, it is thus necessary to use a frequency divider whose division ratio has a non-integer value. Such frequency dividers are commonly referred to as "fractional-N" frequency dividers. Their division ratio is determined by at least two parameters.

A user who would like to replace a frequency divider whose division ratio is an integer by a fractional-N type divider in order to improve the noise performance of a phase-locked loop while using a higher comparison frequency, must, in principle, supply two, instead of one, control words to the frequency divider, which will require the user to make substantial and expensive modifications in the phase-locked loop as designed by the user in the known model.

It is an object of the invention to overcome this drawback by proposing a frequency converter intended to replace the frequency dividers present inside the known phase-locked loops, which frequency converter can be programmed by the user by means of a unique control word, although the phase-locked loop thus obtained can use a comparison frequency that is higher than that in the known phase-locked loop, thus enabling a better noise performance to be achieved without modifying the minimum interval between two oscillation frequencies.

Indeed, in accordance with the invention, a frequency converter as described in the opening paragraph additionally includes interface means arranged between the input port and the frequency divider, and intended to carry out a conversion of a value of the control word into a first and a second parameter defining a non-integer value of the division ratio of the frequency divider.

By virtue of the invention, the two parameters necessary to define a non-integer division ratio of the frequency divider are extracted within the frequency converter, in a manner that is perfectly transparent to the user, on the basis of the value N of the control word elaborated by the user to program a known phase-locked loop using a frequency divider having an integer division ratio.

For a large number of known fractional-N type dividers, the division ratio R can be expressed by the formula $R=M+k/q$, where M and k are the first and the second parameter, q being a third integer parameter whose value is predetermined by the value of the minimum interval between two oscillation frequencies, which is to be kept constant. Thus, $q=FCOMP/FSTEP$, where FCOMP is the chosen comparison frequency and FSTEP is the minimum interval. In such a case, the interface means included in the frequency converter in accordance with the invention advantageously comprise:

means for computing the integer part of the ratio N/q, between the value of the control N and that of the third parameter q, which integer part constitutes the first parameter M, and means for computing the difference N-M.q between the value of the control word and the value of the product of the first and third parameters, which difference constitutes the second parameter k.

In such an embodiment of the invention, the first parameter is formed by the quotient of the division of the value N of the control word by the value of the third parameter q, while the second parameter k is formed by the remainder of such a division.

In a particularly advantageous embodiment of the invention, if the third parameter is coded on P bits, the interface means contain:

a shift register intended to receive the control word, coded on L bits, of which the P most significant bits may be subjected to a parallel loading operation, a P bit adder intended to receive at an input the P most significant bits of the shift register, and to receive, at another input, the two's complement of the third parameter, and a sequencer intended to clock L-P computing steps, each computing step including the following operations:

adding the values present at the inputs of the adder, loading the P least significant bits of the result of the addition to the P most significant bits of the shift register, if the result is positive, loading, into a storage flip-flop next to the least significant bit of the shift register, a carry bit produced by the adder, and shifting the content of the shift register in the direction of the most significant bits, the value of the least significant bit of this register becoming the value of the carry bit.

As stated hereinabove, a frequency converter in accordance with the invention will be advantageously employed in a phase-locked loop intended to regulate the frequency of an oscillator, as it enables the noise performance of such a loop to be improved in a manner that is transparent to a user accustomed to the known phase-locked loops. Therefore, the invention also relates to a phase-locked loop comprising:

an oscillator intended to produce an output signal having an oscillation frequency whose value depends on the value of a tuning signal, a phase/frequency detector intended to compare the oscillation frequency with a so-called comparison frequency of a reference signal, and to supply the tuning signal to the oscillator, the value of said tuning signal depending on the result of the comparison, and a frequency divider described hereinbefore, which is arranged between the oscillator and the phase/frequency detector.

In an embodiment of such phase-locked loops, the invention finally relates to a device intended to receive radioelectric signals, for example a television receiver or a radiotelephone, comprising:

an input stage system intended to receive a radioelectric signal and to convert said signal to an electronic output signal having a so-called radio frequency, an oscillator intended to supply an output signal having a so-called oscillation frequency, and a mixer intended to receive the output signals from the input stage and the oscillator, and to supply a signal whose frequency is equal to the difference between the radio frequency and the oscillation frequency, which device is characterized in that it comprises, in addition, a phase-locked loop as described hereinabove, which is intended to adjust the value of the oscillation frequency.

These and other aspects of the invention will be apparent from and elucidated with reference to the non-limitative exemplary embodiment(s) described hereinafter.

Figure 2:
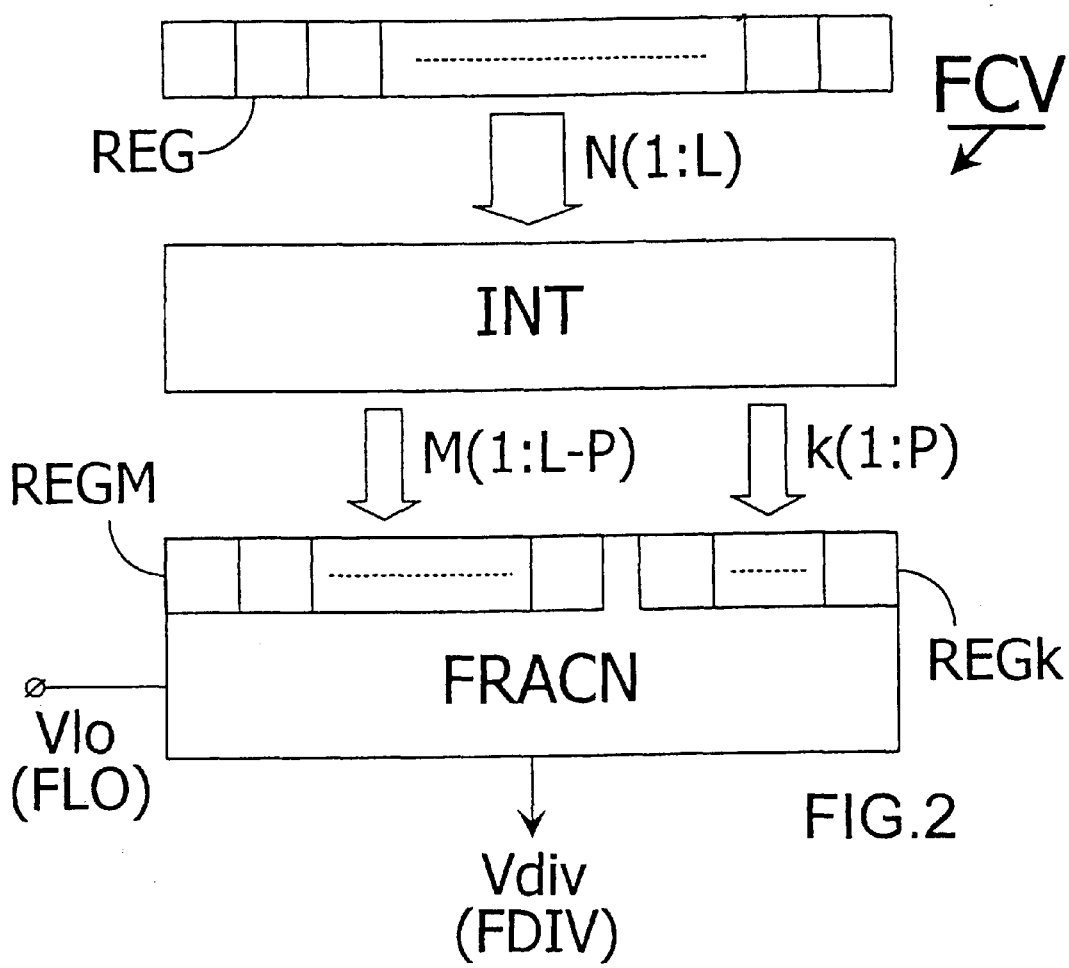
Figure 3:
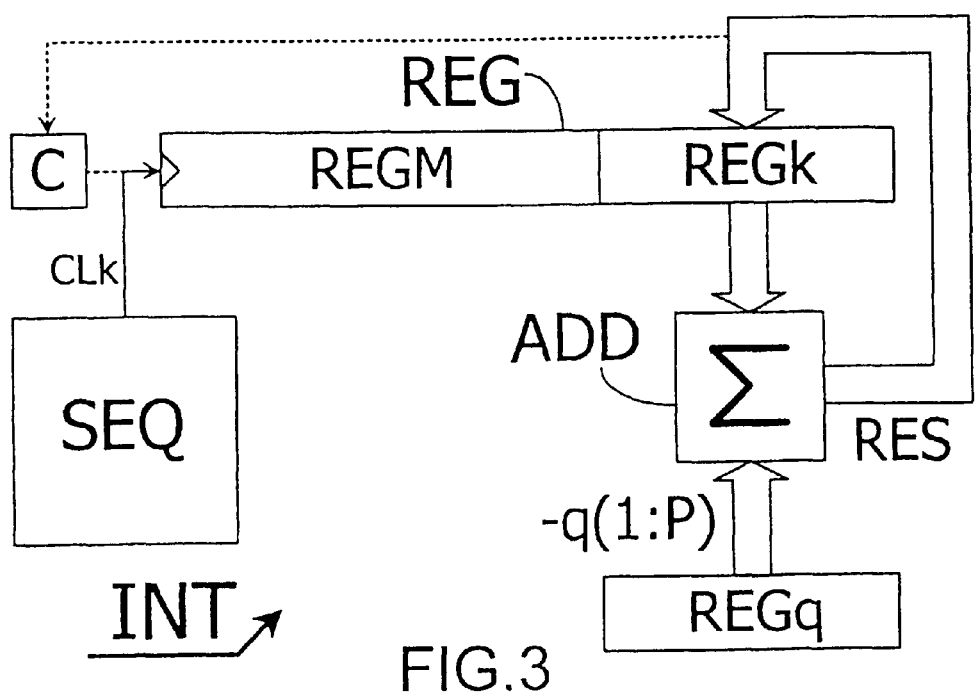

In the drawings:

FIG. 1 is a partial functional diagram illustrating a device for receiving radioelectric signals providing implementation of the invention, FIG. 2 is a functional diagram which diagrammatically illustrates a frequency converter in accordance with the invention, and FIG. 3 is a functional diagram illustrating interface means included in a frequency converter in accordance with a preferred embodiment of the invention.

FIG. 1 diagrammatically shows a device for receiving radioelectric signals, such as a receiver of television signals, comprising an input stage AF, for example an antenna and filtering system, enabling the reception of a signal whose frequency is selected from a range of given frequencies, and its transformation into an electronic signal Vfr, commonly referred to as radio signal, having a frequency FR, commonly referred to as radio frequency, in which device a frequency shift, from the selected frequency FR towards a predetermined intermediate frequency FI, is carried out by means of a mixer MX intended to receive the radio signal Vfr, on the one hand, and an output signal Vlo of a local oscillator OSC, on the other hand.

The intermediate frequency FI is fixed and equal to the difference between the radio frequency FR and the oscillation frequency FLO of the output signal Vlo of the first local oscillator OSC. The choice of said oscillation frequency FLO thus determines the value of the selected radio frequency FR.

In this device, the oscillation frequency FLO of the output signal Vlo of the first local oscillator OSC is controlled by means of a phase-locked loop, which comprises:

the local oscillator OSC intended to supply the output signal Vlo whose frequency FLO is determined by the value of a tuning voltage Vtun, a frequency converter FCV intended to receive the output signal Vlo from the local oscillator OSC, and to supply an output signal Vdiv having a frequency FDIV, a control word coded on L bits N(1:L), programmed by the user of the device defining a division ratio R between the oscillation frequency FLO and the frequency FDIV of the output signal of the frequency converter FCV, a phase/frequency detector PD intended to compare the frequency FDIV of the output signal Vdiv of the frequency converter FCV with a comparison frequency FCOMP of a reference signal Vcomp originating, in this example, from a quartz oscillator XTAL, and to supply driving signals V1 and V2 which are representative of the result of said comparison, and a charge pump CP, the conduction of which is intended to be controlled by driving signals V1 and V2, an output of the charge pump CP being connected to a capacitor Cs intended to generate the tuning voltage Vtun at its terminals.

If the oscillation frequency FLO of the first local oscillator OSC is lower than R times the frequency FCOMP of the reference signal Vcomp, the phase detector PD places a first driving signal V1 into an active mode, which commands the charge pump CP to supply a positive current Ics. This current, which is transmitted to the capacitor Cs, causes an increase of the value of the tuning voltage Vtun taken from the terminals of the capacitor Cs and hence an increase of the oscillation frequency FLO.

When the oscillation frequency FLO becomes higher than the frequency of the reference signal Vcomp, the phase detector PD places a second driving signal V2 into the active mode, which is complementary to the first control signal V1, thus causing an inversion of the direction of the current Ics, which becomes negative. This negative current, which is transmitted to the capacitor Cs, causes a reduction of the value of the tuning voltage Vtun taken from the terminals of the capacitor Cs, and hence a reduction of the oscillation frequency FLO. The phase-locked loop tends towards a balanced operating mode wherein FLO=R.FDIV=R.FCOMP.

In many known phase-locked loops, the frequency converter is just a frequency divider having an integer division ratio, the value of which is equal to that of the control word N(1:L). In this type of systems, the minimum interval FSTEP between two oscillation frequencies is (N+1).FCOMP−N.FCOMP, and hence is equal to the comparison frequency FCOMP itself. However, this minimum interval FSTEP is fixed by the application for which the receiver is intended. If, for example, this device is intended to receive hertzian digital television signals, the minimum interval FSTEP is equal to 166.67 kHz in accordance with the OFDM standard.

Increasing the comparison frequency FCOMP, with a view to improving the noise performance of the phase-locked loop, by using a frequency divider having an integer division ratio is not possible, since this would lead to an increase of the minimum interval FSTEP.

To maintain a constant minimum interval FSTEP, while increasing the value of the comparison frequency FCOMP, it is thus necessary to employ, inside the frequency converter, a "fractional-N" frequency divider which has a non-integer division ratio value, and is determined by at least two parameters.

Consequently, a user who would like to substitute a frequency divider having an integer division ratio with a fractional-N type divider in order to improve the noise performance of a phase-locked loop by using a higher comparison frequency, must in principle provide said frequency divider with two control words instead of one, which will require the user to make substantial and expensive modifications in the phase-locked loop as designed by the user in the known model.

The frequency converter FCV in accordance with the invention can be programmed by means of a unique control word N(1:L) and carries out a non-integer division of the oscillation frequency FLO, thus enabling a comparison frequency FCOMP to be used, which is higher than the imposed minimum interval FSTEP between two oscillation frequencies, in order to improve the noise performance of the phase-locked loop.

FIG. 2 diagrammatically shows a frequency converter FCV in accordance with the invention, which comprises:
- a frequency divider FRACN intended to receive the output signal Vlo from the local oscillator and to supply an output signal Vdiv having a so-called output frequency FDIV, and
- a register REG connected to an input port intended to receive the control word N(1:L).

The frequency converter FCV additionally comprises interface means INT, which are arranged between the input port and the frequency divider FRACN, and which are intended to carry out a conversion of a value of the control word into a first and a second parameter M(1:L-P) and k(1:P), coded on, respectively, L-P and P bits, which parameters define a non-integer value of the division ratio of the frequency divider FRACN.

In this case, the frequency divider is of the "fractional-N" type and brings about a division ratio R between the frequency FLO of its input signal Vlo and the frequency FDIV of its output signal Vdiv, which can be expressed as follows: R=FLO/FDIV=M+k/q, where M and k are the values of the first and the second parameters M(1:L-P) and k(1:P), q being the value of a third integer parameter, which value is predetermined by the value of the minimum interval between two oscillation frequencies, which minimum interval value must be kept constant. Thus, q=FCOMP/FSTEP, where FCOMP is the selected comparison frequency and FSTEP is the minimum interval. In the example of the hertzian, digital television signals mentioned hereinabove, FSTEP=166.67 kHz, which implies that q=24 if FCOMP is chosen to be equal to 4 MHz. The interface means INT included in the frequency converter FCV comprise:
- means for computing the integer part of the ratio N/q, which constitutes the first parameter M, and
- means for computing the difference N−M.q between the value of the control word and the value of the product of the first and the third parameters, which difference constitutes the second parameter k.

In this embodiment of the invention, the first parameter M is formed by the quotient of the division of the value N of the control word by the value of the third parameter q, while the second parameter k is formed by the remainder of such a division. These operations can be implemented in many different ways and are within the reach of people skilled in the art.

FIG. 3 shows a particularly advantageous embodiment of the interface means INT described hereinabove. In this embodiment, the interface means INT comprise a shift register REG intended to receive the control word N(1:L), which, for reasons of economy, is advantageously formed by the register connected to the input port. The P most significant bits of this register may be subject to a parallel loading operation. The interface means INT additionally comprise a P-bit adder ADD, intended to receive, at an input, the P most significant bits of the shift register, and, at another input, the two's complement of the third parameter −q(1:P). The interface means INT finally comprise a sequencer SEQ intended to clock L-P computing steps. The functioning of these interface means is as follows: in an initial stage, the user loads the control word N(1:L) into the register N. The opposite of the value of the third parameter q(1:P) is automatically loaded into a register REGq, since, as described hereinabove, the value of the third parameter q is known because it is imposed by the application for which the device using the frequency converter is intended. The sequencer SEQ then commands the beginning of a computation cycle. In the course of a first computation step, the P most significant bits of the content of the register REG are compared with the value of the third parameter q(1:P) by means of the adder ADD which subtracts the value of the third parameter from said P most significant bits. If the result of the subtraction is positive, a carry bit assuming the 1 state is stored in a carry flip-flop C. Simultaneously, the result of the subtraction is fed into the P most significant bits of the register REG. If the result of the subtraction is negative, a carry bit assuming the 0 state is stored in the carry flip-flop C, and the P most significant bits of the register REG remain unchanged. In the next computation step, the sequencer commands, by means of a clock signal Clk, a shift of the entire content of the register REG in the direction of the most significant bits, resulting in the carry bit becoming the least significant bit of the content of said register. The order of magnitude of the content of the P most significant bits of the register REG is then increased by 1. Another subtraction operation is carried out by the adder ADD, the result of which, if it is positive, is again fed into the P most significant bits of the register REG. In the subsequent computation step, the sequencer SEQ commands a new shift of the content of the register REG, subsequently a new subtraction, and then a new reloading operation if the result of the subtraction is positive, and so on until the close of the $L^{th}$ computation step, which is the last step in the computation cycle. Indeed, at the close of the $L^{th}$ computation step, the L-P least significant bits of the register REG contain the quotient of the division of the value of the control word N(1:L) by the value of the third parameter q(1:P), and hence the value of the first parameter M(1:L-P). This portion of the register REG thus constitutes the register REGM described hereinabove. The P most significant bits of the register REG contain the remainder of the division of the value of the control word N(1:L) by the value of the third parameter q(1:P), and hence the value of the second parameter K(1:P). This portion of the register REG thus constitutes the register REGk described hereinabove.

What is claimed is:

1. A phase-locked loop comprising:
an oscillator intended to produce an output signal having an oscillation frequency whose value depends on the value of a tuning signal,
a phase/frequency detector intended to compare the oscillation frequency with a so-called comparison frequency of a reference signal, and to supply the tuning signal to the oscillator, the value of said tuning signal depending on the result of the comparison, and a frequency divider arranged between the oscillator and the phase/frequency detector, the frequency divider intended to receive an input signal having an input frequency, and to supply an output signal having an output frequency, and an input port for receiving a control word determining a division ratio between the input and output frequencies of the frequency divider, interface means arranged between the input port and the frequency divider, and for carrying out a conversion of a value of the control word into a first and a second parameter defining a non-integer value of the division ratio of the frequency divider, wherein the division ratio R of the frequency divider is expressed by: R=M+k/q, where M and k are, respectively, the first and the second parameters, and q is a third integer parameter having a value imposed by a predetermined minimum interval to separate two frequency values of the output signal of the frequency divider, wherein the interface means includes:

means for computing an integer part of the ratio N/q between a value of the control word N and that of the third parameter q, wherein the integer part constitutes the first parameter M, and means for computing the difference between the value of the control word and a value of the product of the first and the third parameters, which difference constitutes the second parameter.

2. A device intended to receive radio electric signals, comprising:

an input stage intended to receive a radio electric signal and to convert said signal to an electronic output signal having a so-called radio frequency, an oscillator intended to supply an output signal having a so-called oscillation frequency, a mixer intended to receive the output signals from the input stage and the oscillator, and to supply a signal whose frequency is equal to the difference between the radio frequency and the oscillation frequency, a frequency divider intended to receive an input signal having an input frequency, and to supply an output signal having an output frequency, and an input port for receiving a control word determining a division ratio between the input and output frequencies of the frequency divider, interface means arranged between the input port and the frequency divider, and for carrying out a conversion of a value of the control word into a first and a second parameter defining a non-integer value of the division ratio of the frequency divider, wherein the division ratio R of the frequency divider is expressed by: R=M+k/q, where M and k are, respectively, the first and the second parameters, and q is a third integer parameter having a value imposed by a predetermined minimum interval to separate two frequency values of the output signal of the frequency divider, wherein the interface means includes:

means for computing an integer part of the ratio N/q between a value of the control word N and that of the third parameter q, wherein the integer part constitutes the first parameter M, and means for computing the difference between the value of the control word and a value of the product of the first and the third parameters, which difference constitutes the second parameter.

* * * * *